(12) United States Patent
Cho et al.

(10) Patent No.: US 8,574,964 B2
(45) Date of Patent: Nov. 5, 2013

(54) SEMICONDUCTOR DEVICE AND METHOD OF FORMING ELECTRICAL INTERCONNECTION BETWEEN SEMICONDUCTOR DIE AND SUBSTRATE WITH CONTINUOUS BODY OF SOLDER TAPE

(75) Inventors: SungWon Cho, Kyoung-gi-Do (KR); TaeWoo Lee, Kyoungki-Do (KR); DaeSik Choi, Seoul (KR); KyuWon Lee, Kyoungki-Do (KR)

(73) Assignee: STATS ChipPAC, Ltd., Singapore (SG)

( * ) Notice: Subject to any disclaimer, the term of this patent is extended or adjusted under 35 U.S.C. 154(b) by 216 days.

(21) Appl. No.: 12/760,428

(22) Filed: Apr. 14, 2010

(65) Prior Publication Data
US 2011/0254146 A1 Oct. 20, 2011

(51) Int. Cl.
H01L 21/00 (2006.01)
H01L 21/3205 (2006.01)
H01L 21/4763 (2006.01)
H01L 21/44 (2006.01)

(52) U.S. Cl.
USPC ............ 438/119; 438/121; 438/598; 438/612

(58) Field of Classification Search
USPC ......... 438/615, 121, 108, 111, 119, 612, 613, 438/598; 257/692, 778, 737
See application file for complete search history.

(56) References Cited

U.S. PATENT DOCUMENTS

| | | | |
|---|---|---|---|
| 5,509,203 A * | 4/1996 | Yamashita | 29/879 |
| 6,916,687 B2 | 7/2005 | Ho et al. | |
| 7,718,523 B1 | 5/2010 | Yoo et al. | |
| 2002/0031868 A1* | 3/2002 | Capote et al. | 438/126 |
| 2005/0077542 A1* | 4/2005 | Asai et al. | 257/200 |
| 2008/0020596 A1* | 1/2008 | Hougham et al. | 439/65 |
| 2009/0279275 A1* | 11/2009 | Ayotte et al. | 361/808 |
| 2010/0007019 A1* | 1/2010 | Pendse | 257/737 |
| 2010/0140783 A1* | 6/2010 | Do et al. | 257/692 |

* cited by examiner

*Primary Examiner* — Walter H Swanson
*Assistant Examiner* — Wilner Jean Baptiste
(74) *Attorney, Agent, or Firm* — Robert D. Atkins; Patent Law Group: Atkins & Associates, P.C.

(57) ABSTRACT

A semiconductor device has a flipchip type semiconductor die with contact pads and substrate with contact pads. A flux material is deposited over the contact pads of the semiconductor die and contact pads of the substrate. A solder tape formed as a continuous body of solder material with a plurality of recesses is disposed between the contact pads of the semiconductor die and substrate. The solder tape is brought to a liquidus state to separate a portion of the solder tape outside a footprint of the contact pads of the semiconductor die and substrate under surface tension and coalesce the solder material as an electrical interconnect substantially within the footprint of the contact pads of the semiconductor die and substrate. The contact pads on the semiconductor die and substrate can be formed with an extension or recess to increase surface area of the contact pads.

25 Claims, 13 Drawing Sheets

SEMICONDUCTOR DEVICE AND METHOD OF FORMING ELECTRICAL INTERCONNECTION BETWEEN SEMICONDUCTOR DIE AND SUBSTRATE WITH CONTINUOUS BODY OF SOLDER TAPE

FIELD OF THE INVENTION

The present invention relates in general to semiconductor devices and, more particularly, to a semiconductor device and method of forming an electrical interconnection between a semiconductor die and substrate with a continuous body of solder tape.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

A semiconductor die is typically metallurgically and electrically bonded to a substrate or PCB. The electrical interconnection involves depositing bump material individually on the contact pads of the semiconductor die or substrate, e.g. using a ball drop or screen printing process. The contact pads of the semiconductor die and substrate with bump material are aligned and mated and the bump material is reflowed to form the electrical interconnect. The bump formation is slow, costly, wasteful of bump material, and does not allow for fine pitch electrical interconnects.

SUMMARY OF THE INVENTION

A need exists to provide efficient and low cost electrical interconnect between contact pads of the semiconductor die and contact pads of the substrate. Accordingly, in one embodiment, the present invention is a method of making a semiconductor device comprising the steps of forming solder tape as a continuous body of solder material with a plurality of recesses, providing a semiconductor die with contact pads, depositing flux material over the contact pads of the semiconductor die, providing a substrate with contact pads, transferring a portion of the flux material from the contact pads on the semiconductor die to the contact pads on the substrate, disposing the solder tape between the contact pads of the semiconductor die and contact pads of the substrate, and bringing the solder tape to a liquidus state to separate a portion of the solder tape outside a footprint of the contact pads of the semiconductor die and contact pads of the substrate under surface tension and coalesce the solder material as an electrical interconnect substantially within the footprint of the contact pads of the semiconductor die and contact pads of the substrate.

In another embodiment, the present invention is a method of making a semiconductor device comprising the steps of forming a continuous body of reflowable electrical interconnect material, providing a semiconductor die with contact pads, providing a substrate with contact pads, depositing flux material over the contact pads of the semiconductor die and contact pads of the substrate, disposing the continuous body of reflowable electrical interconnect material between the contact pads of the semiconductor die and contact pads of the substrate, and bringing the reflowable electrical interconnect material to a liquidus state to separate a portion of the continuous body outside a footprint of the contact pads of the semiconductor die and contact pads of the substrate under surface tension and coalesce the reflowable electrical interconnect material substantially within the footprint of the contact pads of the semiconductor die and contact pads of the substrate.

In another embodiment, the present invention is a method of making a semiconductor device comprising the steps of forming a continuous body of electrical interconnect material, providing a semiconductor die with contact pads, providing a substrate with contact pads, disposing the continuous body of electrical interconnect material between the contact pads of the semiconductor die and contact pads of the substrate, and reflowing the electrical interconnect material to separate a portion of the continuous body outside a footprint of the contact pads of the semiconductor die and contact pads of the substrate and coalesce the electrical interconnect material substantially within the footprint of the contact pads of the semiconductor die and contact pads of the substrate.

In another embodiment, the present invention is a semiconductor device comprising a semiconductor die with contact pads and substrate with contact pads. A flux material is deposited over the contact pads of the semiconductor die and contact pads of the substrate. A continuous body of electrical interconnect material is disposed between the contact pads of the semiconductor die and contact pads of the substrate. The electrical interconnect material is reflowed to separate a portion of the continuous body outside a footprint of the contact pads of the semiconductor die and contact pads of the substrate under surface tension and coalesce the electrical interconnect material substantially within the footprint of the contact pads of the semiconductor die and contact pads of the substrate.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
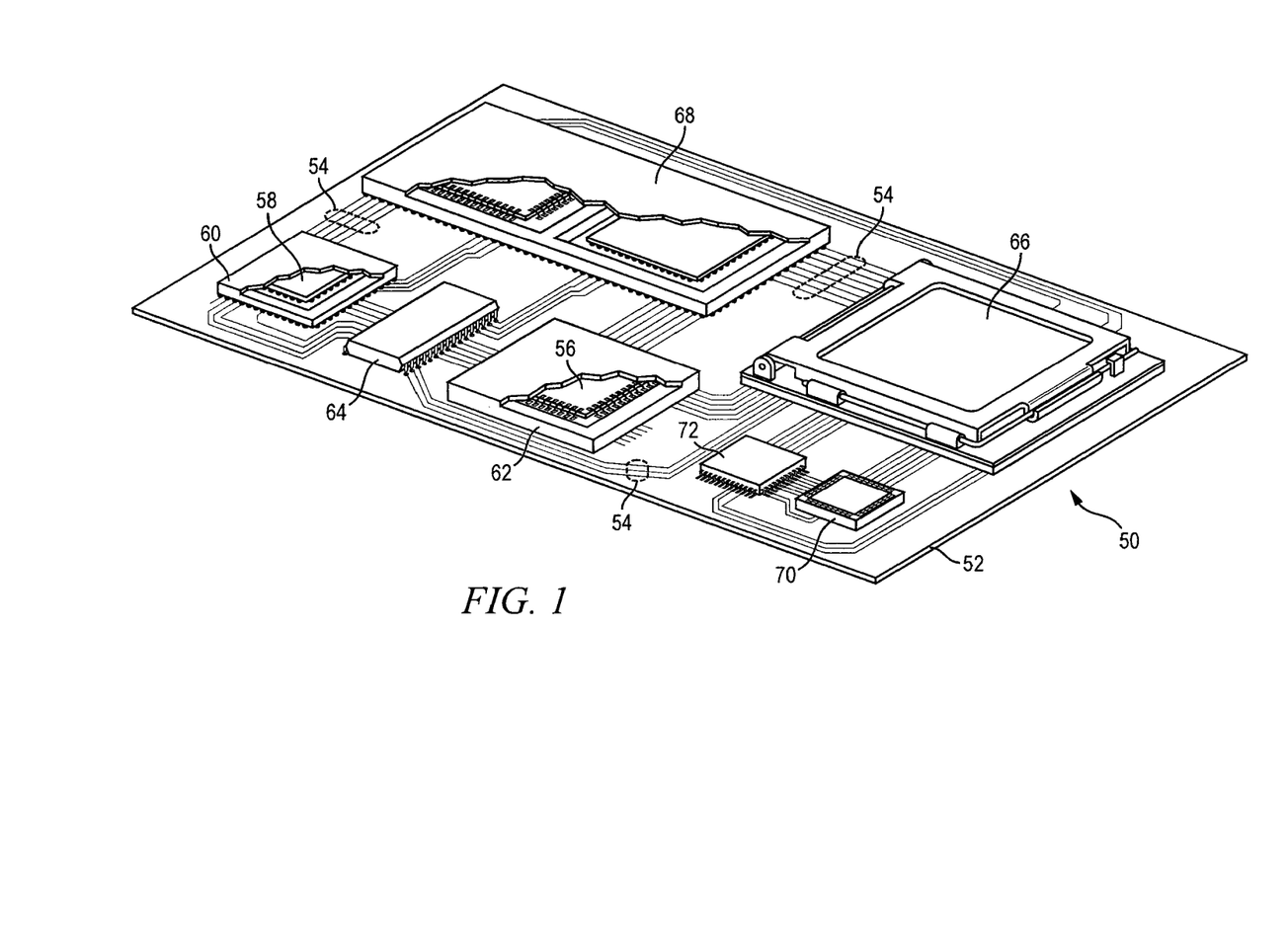
FIG. 1 illustrates a PCB with different types of packages mounted to its surface.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
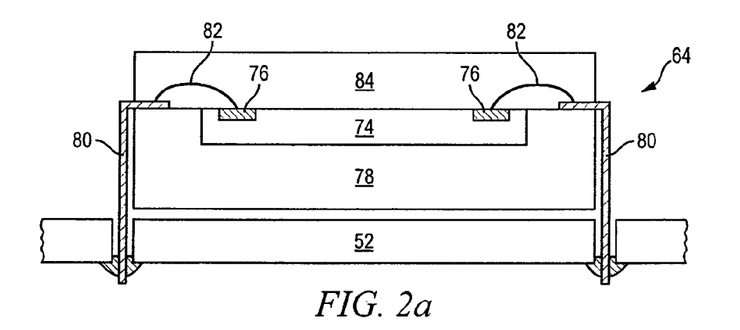
FIGS. 2a-2c illustrate further detail of the representative semiconductor packages mounted to the PCB.
Figure 2B:
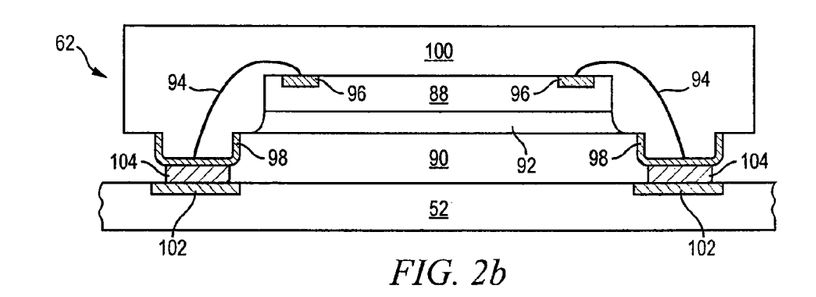
Figure 2C:
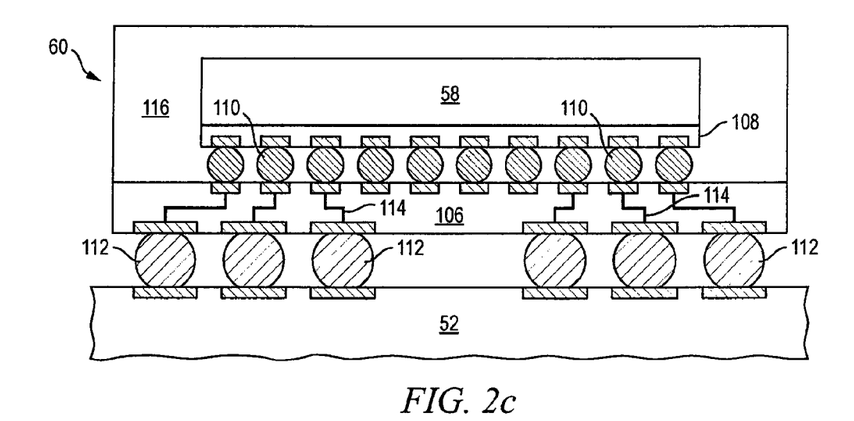

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
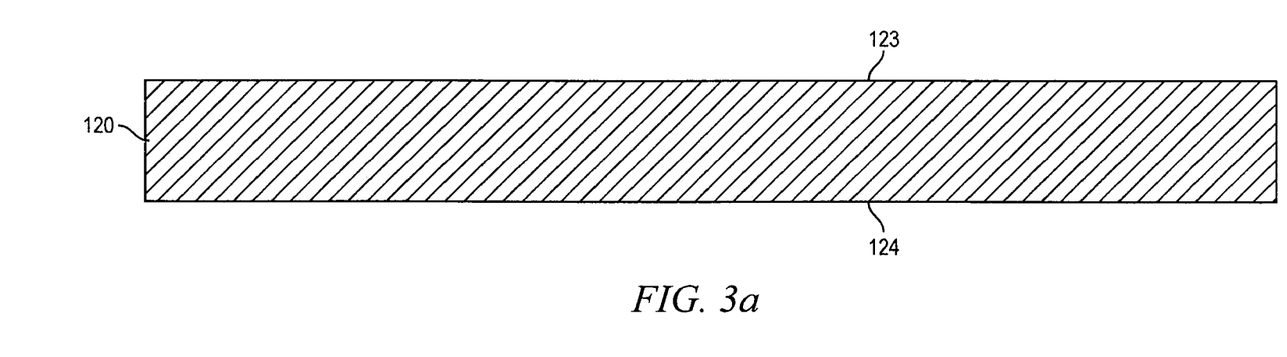
FIGS. 3a-3h illustrate a process of forming a continuous body of solder tape with a plurality of recesses.

FIGS. 3a-3h illustrate, in relation to FIGS. 1 and 2a-2c, a process of forming a continuous body of solder tape for placement between a semiconductor die and substrate to form electrical interconnect bumps. FIG. 3a shows a sheet of solder tape 120 having top surface 123 and bottom surface 124 of sufficient width and length to cover the interconnect area of a semiconductor die. In one embodiment, solder tape 120 has a thickness of 5-20 micrometers (µm). Solder tape 120 contains a continuous body of low-lead or lead-free solder material, bump material, or other reflowable electrical interconnect material suitable for semiconductor devices. The continuous body extends across the length, width, and thickness of solder tape 120. Solder tape 120 can be alloy or mixture of tin, copper, silver, bismuth, indium, zinc, and antimony. For example, solder tape 120 can be a mixture of tin with another metal such as lead, silver, copper, bismuth, zinc, indium, and antimony.

Figure 3B:
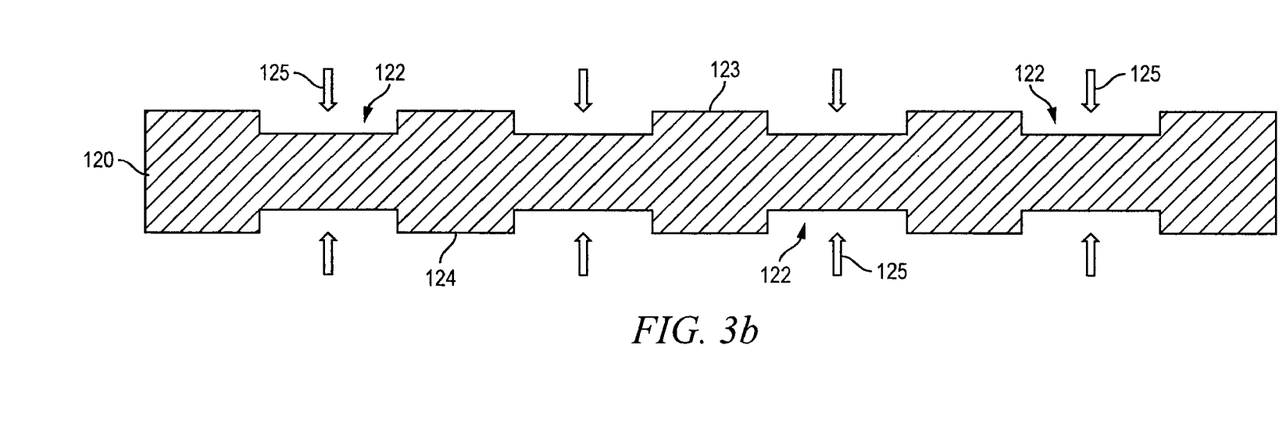
Figure 3C:
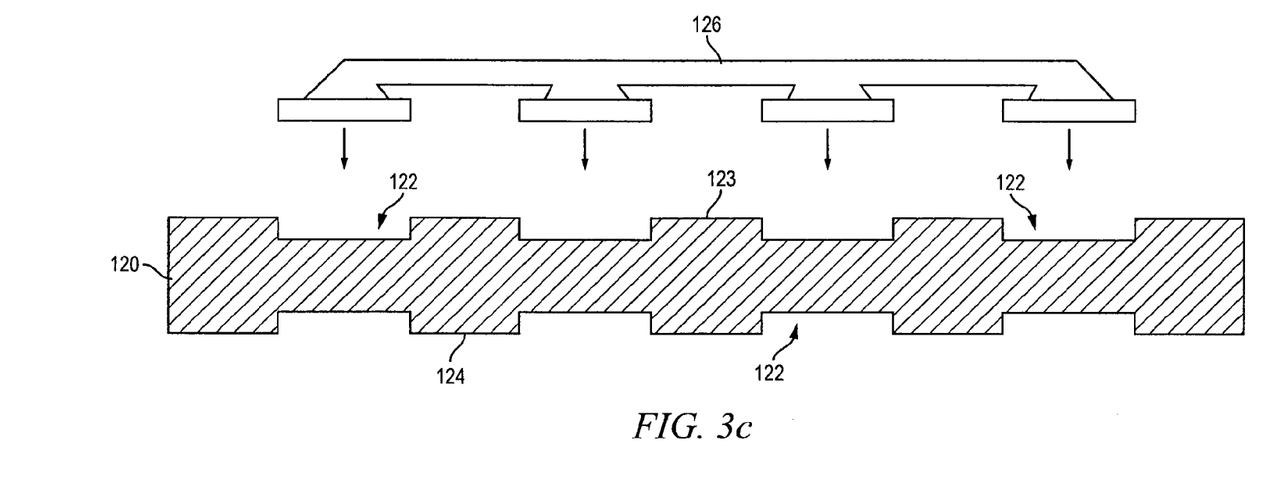

In FIG. 3b, a plurality of grooves or recesses 122 is formed in top surface 123 of solder tape 120 and in bottom surface 124 of solder tape 120 to a depth 5-25% of the thickness of solder tape 120 using laser cutting tool 125. Recesses 122 can also be formed in top surface 123 of solder tape 120 and in bottom surface 124 of solder tape 120 with stamping tool 126, as shown in FIG. 3c.

Figure 3D:
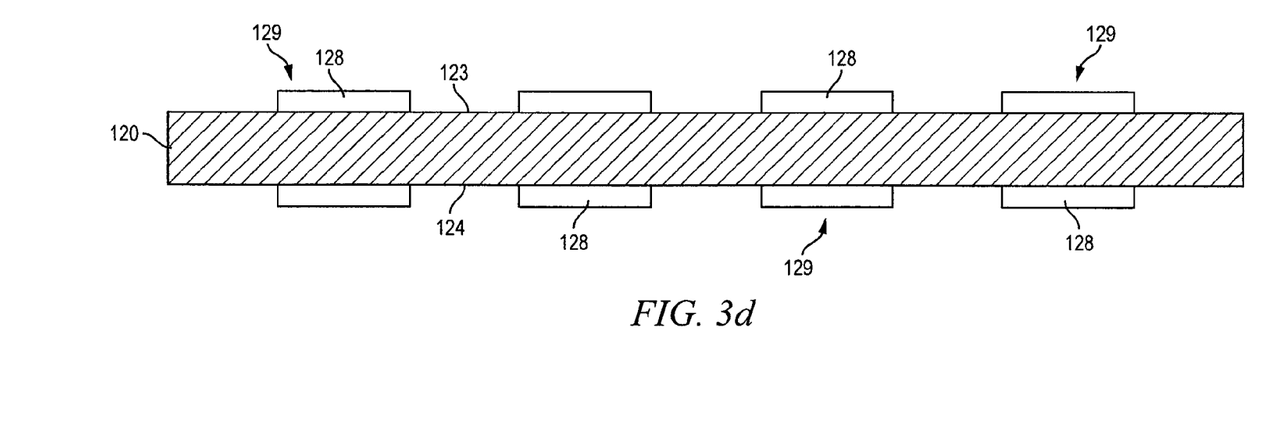
Figure 3E:
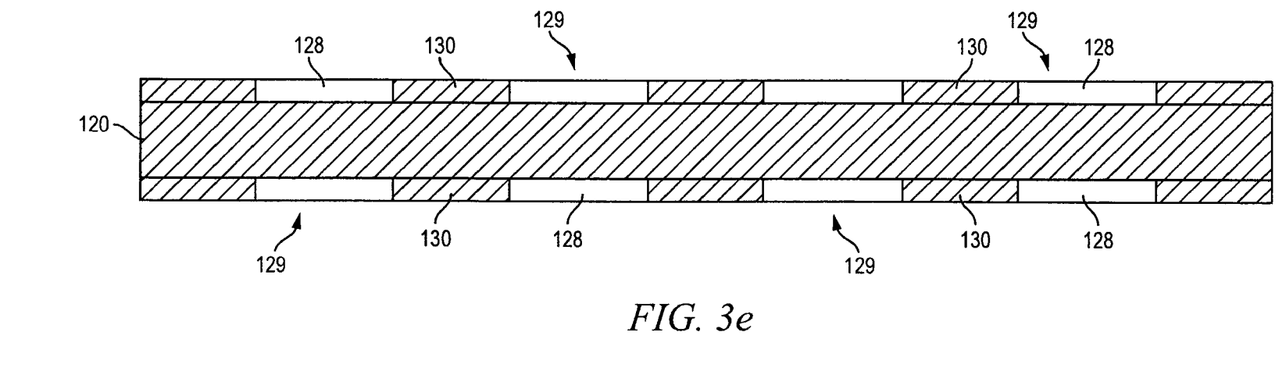
Figure 3F:
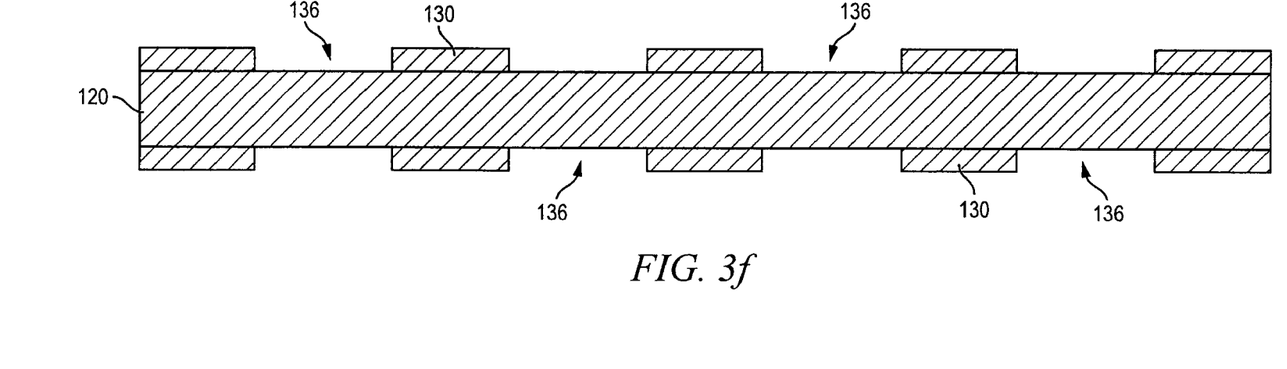

Another method of forming recesses in the top surface and bottom surface of solder tape 120 is shown in FIG. 3d-3f. In FIG. 3d, a passivation or insulating layer 128 is formed over top surface 123 and bottom surface 124 of solder tape 120 by PVD, CVD, printing, spin coating, spray coating, or thermal oxidation. The insulating layer 128 can be one or more layers of SiO2, Si3N4, SiON, Ta2O5, Al2O3, or other material having similar insulating and structural properties. A portion of insulating layer 128 is removed by an etching process leaving the insulating material in areas 129.

In FIG. 3e, a layer of solder material or bump material 130 is formed between areas 129 of insulating layer 128 over top surface 123 and bottom surface 124 using PVD, CVD, electrolytic plating, electroless plating process, or other suitable metal deposition process. Solder material 130 is a similar material as solder tape 120, e.g. low-lead or lead-free solder or alloy of tin, copper, silver, bismuth, indium, zinc, and antimony. The insulating layer 128 is removed from areas 129 by an etching process, leaving recesses 136 in the top surface and bottom surface of solder tape 120, as shown in FIG. 3f.

Figure 3G:
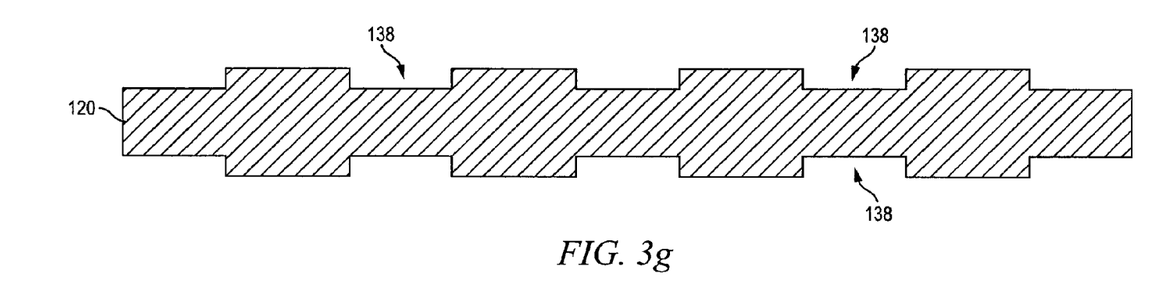

FIG. 3g shows recesses 138 formed in complementary areas of solder tape 120 as compared to recesses 122 and 136. Recesses 138 can be formed as described in FIGS. 3b-3f.

Figure 3H:
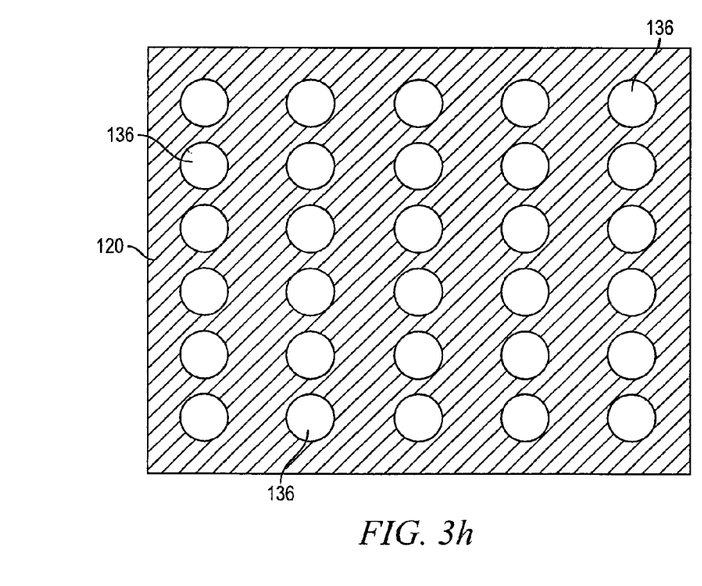

FIG. 3h shows a top view of solder tape 120 as a continuous body with recesses 136 arranged in an array or plurality of rows covering the interconnect area between the semiconductor die and substrate.

Figure 4A:
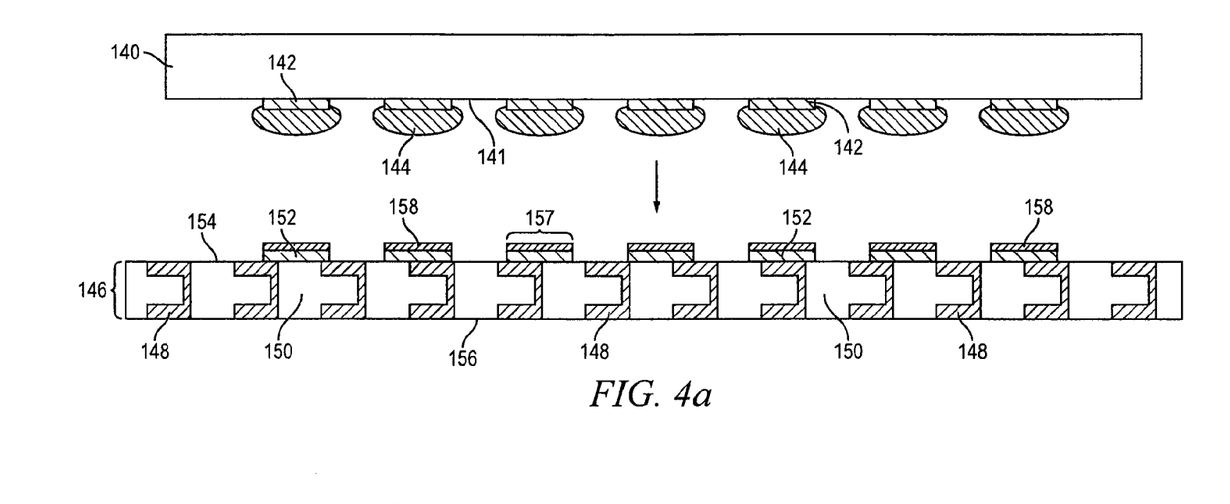
FIGS. 4a-4j illustrate a process of bonding a semiconductor die and substrate with the continuous body of solder tape.

FIG. 4a shows a semiconductor die 140 having an active surface 141 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 141 to implement analog circuits or digital circuits, such as digital signal processor (DSP), ASIC, memory, or other signal processing circuit. Semiconductor die 140 may also contain IPDs, such as inductors, capacitors, and resistors, for RF signal processing.

In one embodiment, semiconductor die 140 is an unbumped flipchip type semiconductor die having a plurality of contact pads 142 formed over active surface 141. A thick layer of flux material 144, such as ammonium chloride or rosin, is deposited over contact pads 142.

A substrate or PCB 146 includes electrically conductive layers or traces 148 formed in the substrate to provide electrical interconnect according to the electrical design and function of semiconductor die 140. The conductive layers and traces 148 extend across substrate 146 and through the substrate between top surface 154 and bottom surface 156 with electrical separation by insulating layer 150. A plurality of contact pads 152 is formed over top surface 154 of substrate 146. Contact pads 142 and contact pads 152 have a top surface area defining footprint 157.

An optional multi-layer under bump metallization (UBM) 158 can be formed over contact pads 152 and/or contact pads 142. UBM 158 includes a barrier layer and adhesion layer. In one embodiment, the barrier layer contains Ni, titanium tungsten (TiW), chromium copper (CrCu), nickel vanadium (NiV), platinum (Pt), or palladium (Pd). The adhesion layer contains Al, titanium (Ti), chromium (Cr), or titanium nitride (TiN). UBM 158 provides a low resistive interconnect, as well as a barrier to solder diffusion.

Figure 4B:
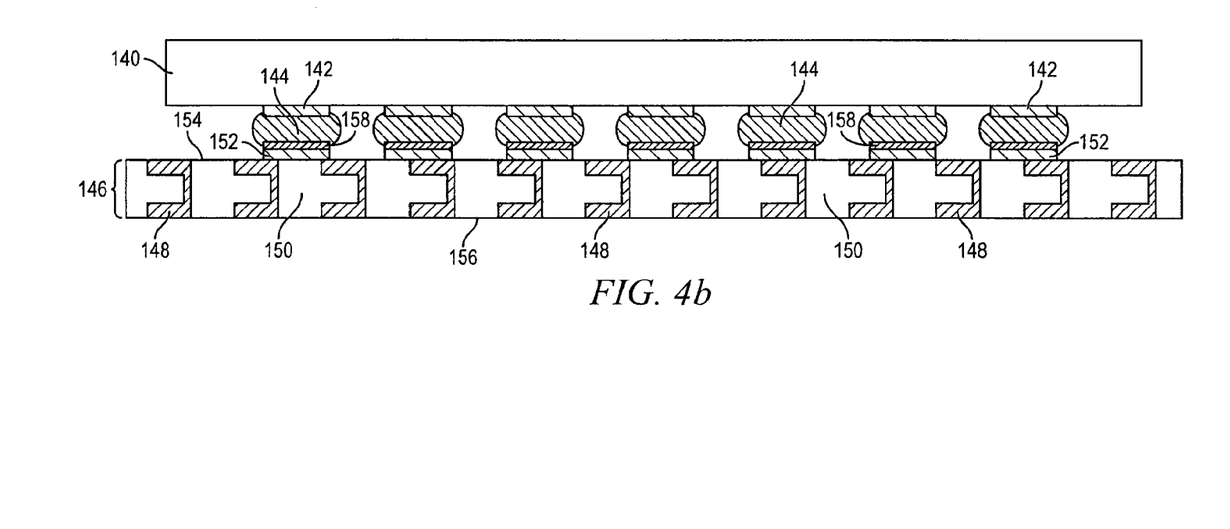
Figure 4C:
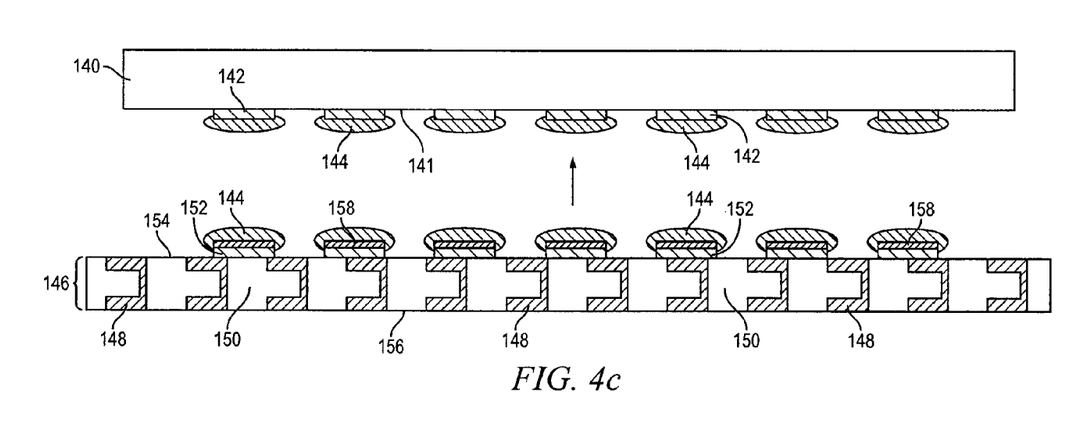

Semiconductor die 140 is positioned over substrate 146 with contact pads 142 aligned to contact pads 152. Semiconductor die 140 is brought into proximity of substrate 146 until flux material 144 covers contact pads 152, as shown in FIG. 4b. A portion of flux material 144 is thereby transferred from contact pads 142 to contact pads 152. Semiconductor die 140 is then moved away from substrate 146, as shown in FIG. 4c. After the flux transfer, flux material 144 covers both contact pads 142 and contact pads 152. The thickness of flux material 144 originally deposited on contact pads 142 is sufficient to cover both contact pads 142 and 152 following the flux transfer. Alternatively, flux material 144 can be separately deposited on contacts pads 142 and contact pads 152 without bringing semiconductor die 140 into proximity of substrate 146.

Figure 4D:
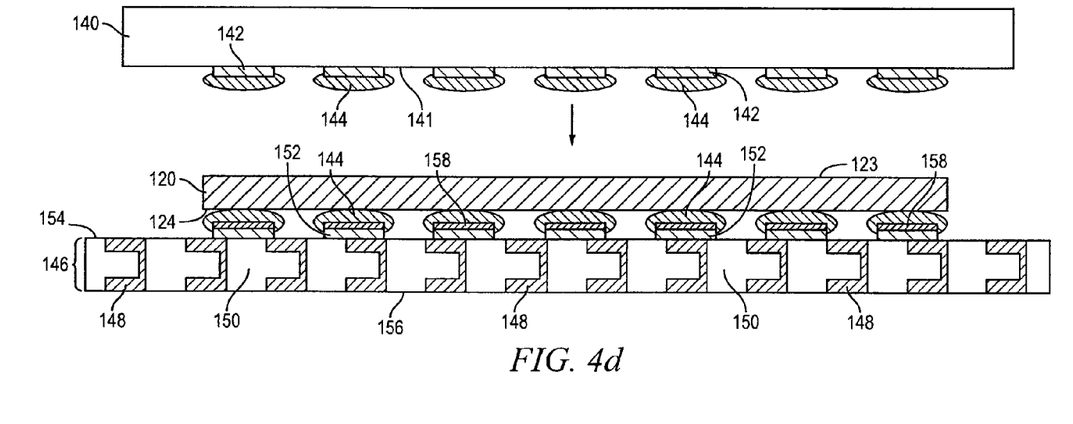
Figure 4E:
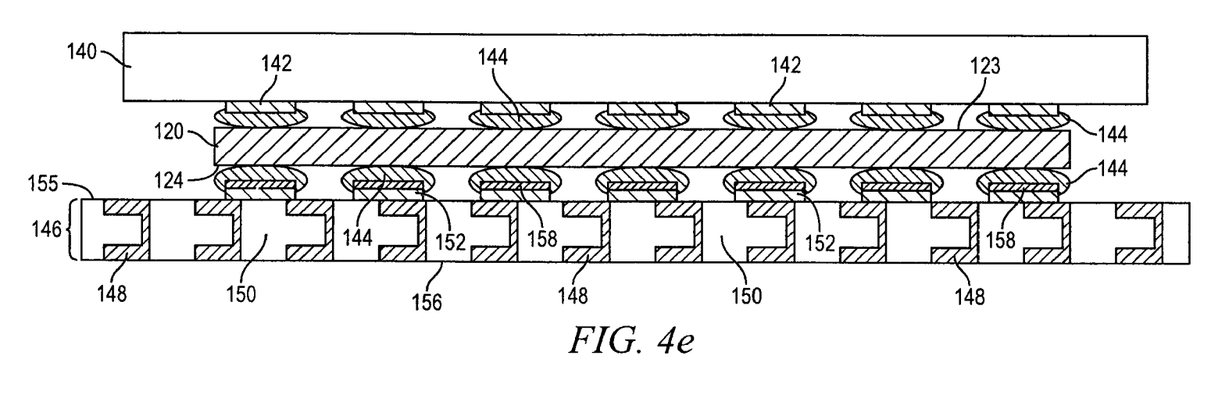

In FIG. 4d, solder tape 120, as described in FIG. 3a, is placed between contact pads 142 and contact pads 152. In one embodiment, solder tape 120 is placed over flux material 144 on contact pads 152. Solder tape 120 could also be placed over flux material 144 on contact pads 142. Solder tape 120 covers an interconnect area between semiconductor die 140 and substrate 146 defined by the area encompassing contact pads 142 and contact pads 152. Semiconductor die 140 is brought into proximity of substrate 146 until flux material 144 on contact pads 142 touches top surface 123 of solder tape 120 and flux material 144 on contact pads 152 touches bottom surface 124 of solder tape 120, as shown in FIG. 4e.

Figure 4F:
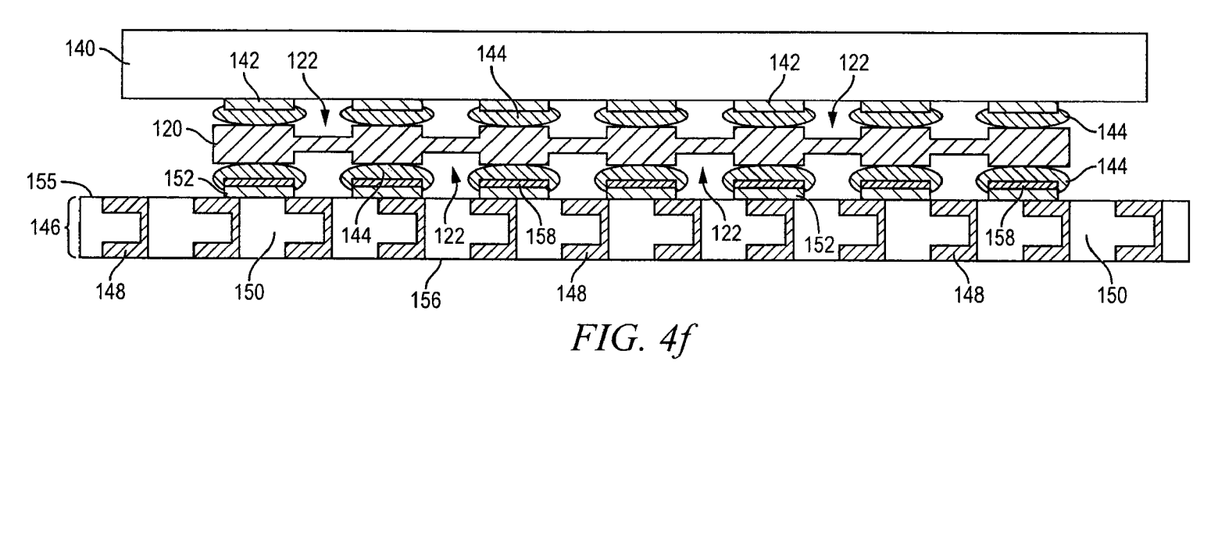

As another embodiment, FIG. 4f shows solder tape 120 with recesses 122 or 136, as described in FIG. 3b, 3c, or 3f, placed between contact pads 142 and contact pads 152. Solder tape 120 is positioned with recesses 122 or 136 aligned outside footprint 157 of contact pads 142 and contact pads 152. Recesses 122 or 136 reduce the thickness of solder tape 120 from 5-20 μm within footprint 157 to 2.5-18.0 μm outside footprint 157. Semiconductor die 140 is brought into proximity of substrate 146 until flux material 144 on contact pads 142 touches the thicker portion of solder tape 120 between recesses 122 and flux material 144 on contact pads 152 touches the thicker portion of solder tape 120 between recesses 122.

Figure 4G:
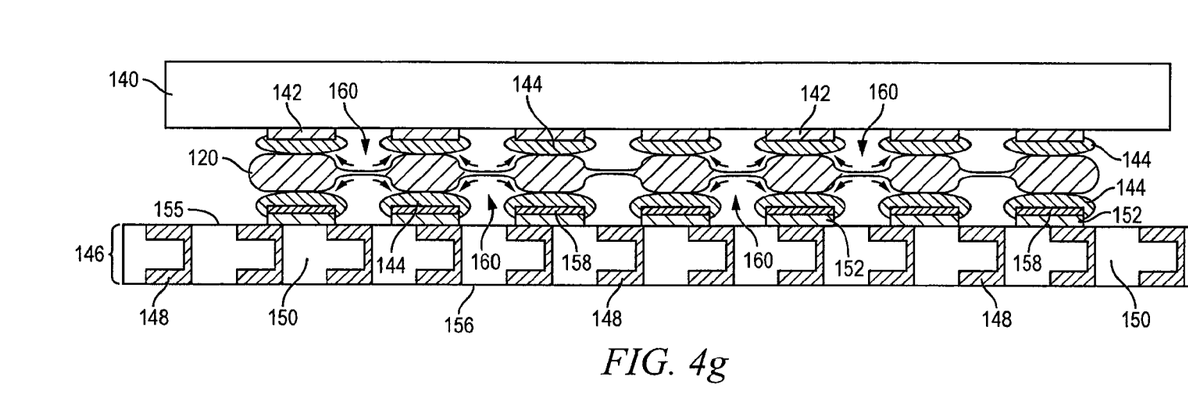
Figure 4H:
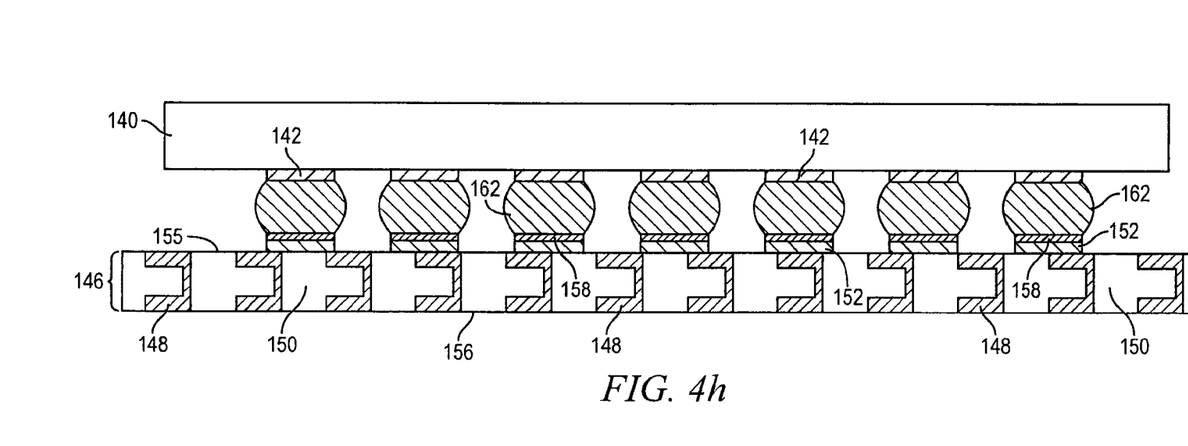

In FIG. 4g, solder tape 120 is brought to a reflow or liquidus state. For example, semiconductor die 140 and substrate 146 are placed in a reflow oven for 60 to 120 seconds at 220-260° C. The flux material and reflow solder induces surface tension 160, which thins the solder material outside footprint 157 of contact pads 142 and contact pads 152. The flux material diffuses or evaporates, while a portion of solder tape 120 outside footprint 157 of contact pads 142 and contact pads 152 separates under surface tension 160. The solder material coalesces substantially within footprint 157 of contact pads 142 and contact pads 152 as bumps 162, as shown in FIG. 4h. Contact pads 142 of flipchip type semiconductor die 140 are metallurgically and electrically bonded to contact pads 152 of substrate 146 by bumps 162. The electrical interconnect is achieved without a conventional bumping process, as described in the background. The solder tape bump formation of FIGS. 4a-4g shortens manufacturing time and reduces cost. Bumps 162 provide greater standoff height for semiconductor die 140. Solder tape 120 formed with recesses 122 or 136 is easily separated by surface tension 160 and offers fine pitch interconnect.

Figure 4I:
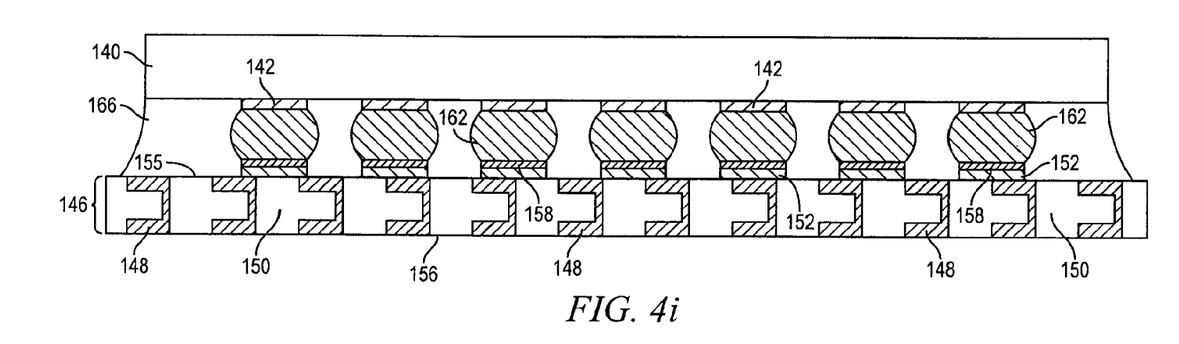

In FIG. 4i, an underfill material 166 such as epoxy resin is deposited between semiconductor die 140 and substrate 146 around contact pads 142, contact pads 152, and bumps 162.

Figure 4J:
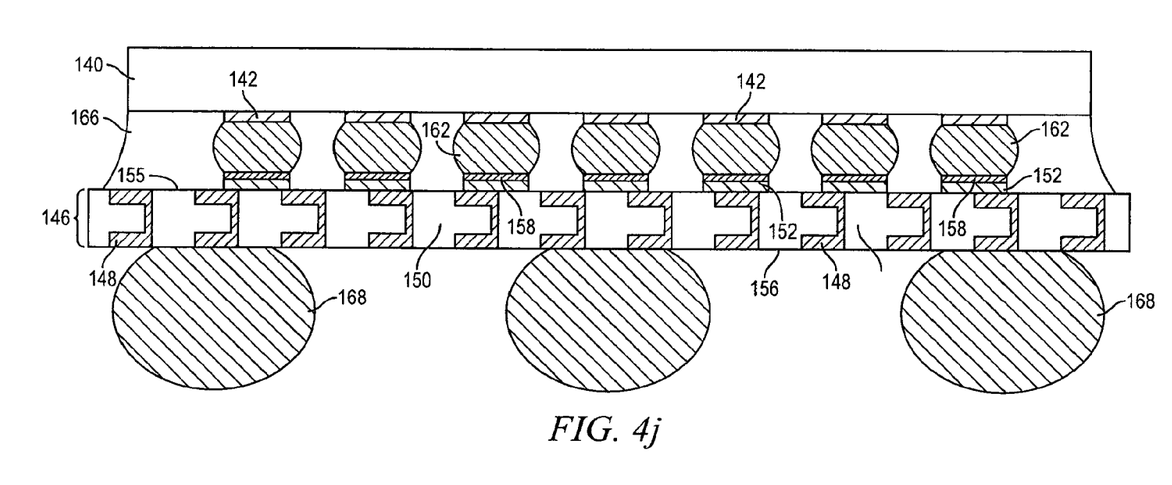

In FIG. 4j, an electrically conductive bump material is deposited over conductive layer 148 on bottom surface 156 of substrate 146 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 148 using a suitable attachment or bonding process. In one embodiment, the bump material is reflowed by heating the material above its melting point to form spherical balls or bumps 168. In some applications, bumps 168 are reflowed a second time to improve electrical contact to conductive layer 148. The bumps can also be compression bonded to conductive layer 148. Bumps 168 represent one type of interconnect structure that can be formed over conductive layer 148. The interconnect structure can also use bond wires, stud bump, micro bump, or other electrical interconnect.

Figure 5:
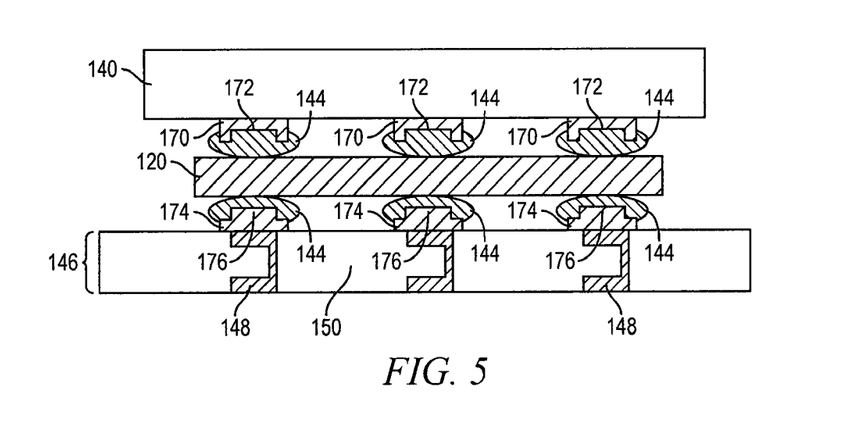
FIG. 5 illustrates the contact pads on the semiconductor die with recesses and contact pads on the substrate with extensions.

In another embodiment, FIG. 5 shows a portion of the contact pads formed over semiconductor die 140 and substrate 146. Contact pads 170 formed over semiconductor die 140 have recess 172. Contact pads 174 formed over substrate 146 have extension 176. Recess 172 and extension 176 control solder volume during reflow and increase the surface area of contact pads 170 and contact pads 174 for greater surface tension to separate solder tape 120 between the contact pads. Recess 172 and extension 176 allow for fine pitch interconnect.

Figure 6:
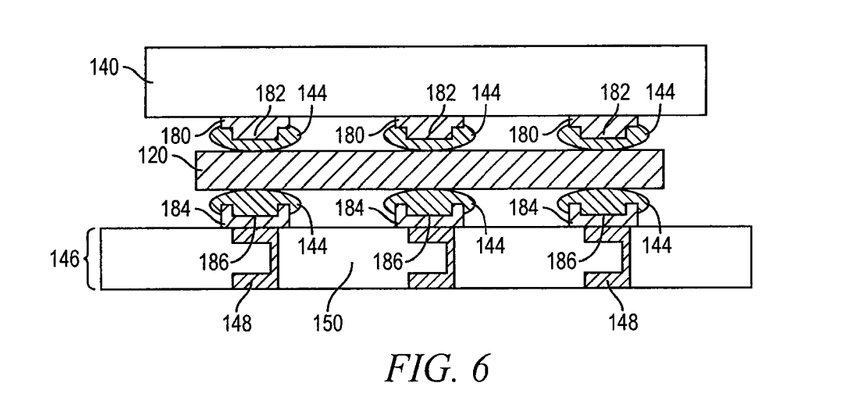
FIG. 6 illustrates the contact pads on the semiconductor die with extensions and contact pads on the substrate with recesses.

FIG. 6 shows another embodiment with a portion of the contact pads formed over semiconductor die 140 and substrate 146. Contact pads 180 formed over semiconductor die 140 have extension 182. Contact pads 184 formed over substrate 146 have recess 186. Extension 182 and recess 186 control solder volume during reflow and increase the surface area of contact pads 180 and contact pads 184 for greater surface tension to separate solder tape 120 between the contact pads. Extension 182 and recess 186 allow for fine pitch interconnect.

Figure 7:
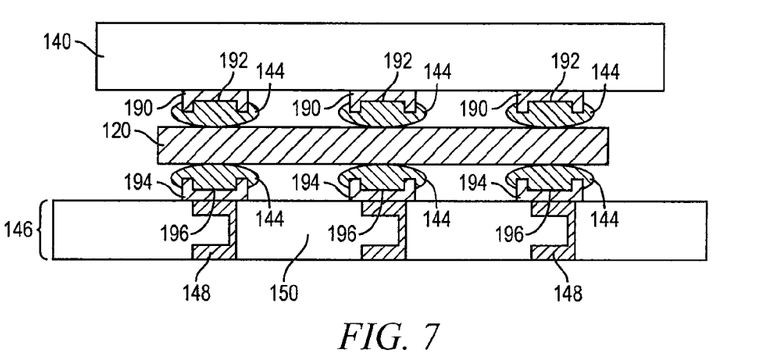
FIG. 7 illustrates the contact pads on the semiconductor die with recesses and contact pads on the substrate with recesses.

FIG. 7 shows another embodiment with a portion of the contact pads formed over semiconductor die 140 and substrate 146. Contact pads 190 formed over semiconductor die 140 have recess 192. Contact pads 194 formed over substrate 146 have recess 196. Recess 192 and recess 196 control solder volume during reflow and increase the surface area of contact pads 190 and contact pads 194 for greater surface tension to separate solder tape 120 between the contact pads. Recess 192 and recess 196 allow for fine pitch interconnect.

Figure 8:
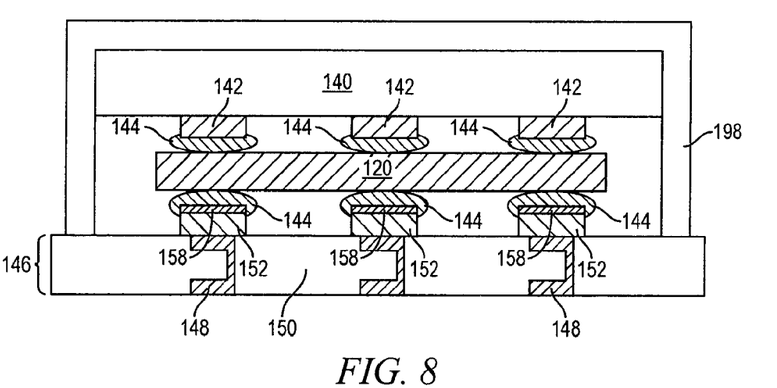
FIG. 8 illustrates a support structure around the semiconductor die and substrate.

FIG. 8 shows a support member 198 placed over semiconductor die 140 and affixed to substrate 146. Support member 198 maintains alignment and coplanarity between contact pads 142 and contact pads 152. Support member 198 also maintains proper solder volume during reflow.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    forming a tape as a continuous body of conductive material with a plurality of recesses;
    providing a semiconductor die with contact pads;
    depositing a flux material over the contact pads of the semiconductor die;
    providing a substrate with contact pads;
    transferring a portion of the flux material from the contact pads on the semiconductor die to the contact pads on the substrate;
    disposing the tape between the contact pads of the semiconductor die and the contact pads of the substrate; and
    bringing the tape to a liquidus state to separate a portion of the tape outside a footprint of the contact pads of the semiconductor die and the contact pads of the substrate.

2. The method of claim 1, further including forming the recesses in the tape with a laser cutting tool or stamping tool.

3. The method of claim 1, further including:
    forming an insulating layer over the tape;
    removing a portion of the insulating layer to expose the tape;
    forming conductive material over the exposed tape; and
    removing the insulating layer to provide the recesses in the tape.

4. The method of claim 1, further including depositing underfill material between the semiconductor die and substrate.

5. The method of claim 1, further including:
    forming the contact pads on the semiconductor die with an extension or recess to increase a surface area of the contact pads; and
    forming the contact pads on the substrate with an extension or recess to increase the surface area of the contact pads.

6. The method of claim 1, wherein the semiconductor die is a flipchip type semiconductor die.

7. A method of making a semiconductor device, comprising:
    forming a continuous body of conductive material;
    providing a semiconductor die with contact pads;
    providing a substrate with contact pads;
    depositing a flux material over the contact pads of the semiconductor die and the contact pads of the substrate;
    disposing the continuous body of conductive material between the contact pads of the semiconductor die and the contact pads of the substrate; and
    bringing the conductive material to a liquidus state to separate a portion of the continuous body outside a footprint of the contact pads of the semiconductor die and the contact pads of the substrate.

8. The method of claim 7, further including forming a plurality of recesses in the continuous body of conductive material.

9. The method of claim 7, further including forming a plurality of recesses in the continuous body of conductive material by:
    forming an insulating layer over the continuous body;
    removing a portion of the insulating layer to expose the continuous body;
    forming conductive material over the exposed continuous body; and
    removing the insulating layer.

10. The method of claim 7, further including:
    forming the contact pads on the semiconductor die with an extension or recess to increase surface area of the contact pads; and forming the contact pads on the substrate with an extension or recess to increase surface area of the contact pads.

11. The method of claim 7, wherein the depositing the flux material over the contact pads of the substrate includes transferring a portion of the flux material from the contact pads on the semiconductor die to the contact pads on the substrate.

12. The method of claim 7, further including disposing a support member over the semiconductor die and substrate.

13. The method of claim 7, wherein the semiconductor die is a flipchip type semiconductor die.

14. A method of making a semiconductor device, comprising:
    forming a continuous body of an interconnect material;
    providing a semiconductor die with contact pads;
    providing a substrate with contact pads;
    disposing the continuous body of interconnect material between the contact pads of the semiconductor die and the contact pads of the substrate; and
    reflowing the interconnect material to separate a portion of the continuous body outside a footprint of the contact pads of the substrate.

15. The method of claim 14, further including forming a plurality of recesses in the continuous body of interconnect material.

16. The method of claim 14, further including forming recesses in the continuous body of interconnect material by:
    forming an insulating layer over the continuous body;
    removing a portion of the insulating layer to expose the continuous body;
    forming interconnect material over the exposed continuous body; and
    removing the insulating layer.

17. The method of claim 14, further including:
    forming the contact pads on the semiconductor die with an extension or recess to increase surface area of the contact pads; and
    forming the contact pads on the substrate with an extension or recess to increase surface area of the contact pads.

18. The method of claim 14, further including depositing flux material over the contact pads of the semiconductor die and the contact pads of the substrate.

19. The method of claim 18, wherein depositing the flux material over the contact pads of the substrate includes transferring a portion of the flux material from the contact pads on the semiconductor die to the contact pads on the substrate.

20. The method of claim 14, further including disposing a support member over the semiconductor die and substrate.

21. A method of making a semiconductor device, comprising:
    forming a continuous body of conductive material;
    providing a semiconductor die including first contact pads;
    providing a substrate including second contact pads;
    disposing the continuous body of conductive material between the semiconductor die and substrate; and
    reflowing the continuous body into interconnects between the first contact pads and second contact pads of conductive material to separate portions of the continuous body.

22. The method of claim 21, further including forming a plurality of recesses in the continuous body of conductive material.

23. The method of claim 21, further including:
    forming the first contact pads on the semiconductor die with an extension or recess to increase a surface area of the first contact pads; and
    forming the second contact pads on the substrate with an extension or recess to increase a surface area of the second contact pads.

24. The method of claim 21, further including depositing flux material over a surface of the semiconductor die and a surface of the substrate.

25. The method of claim 21, further including disposing a support member over the semiconductor die and substrate.

* * * * *